United States Patent [19]

Frans et al.

[11] Patent Number: 5,939,892
[45] Date of Patent: *Aug. 17, 1999

[54] CIRCUIT BOARD TESTING FIXTURE

[75] Inventors: John S. Frans, Clairmont; Joseph M. Creeden, Alto Loma, both of Calif.

[73] Assignee: Methode Electronics, Inc., Chicago, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/631,407

[22] Filed: Apr. 12, 1996

[51] Int. Cl.[6] ............................. G01R 31/02; G01R 1/073
[52] U.S. Cl. ............................................. 324/761; 324/758
[58] Field of Search ................................. 324/761, 758, 324/754

[56] References Cited

U.S. PATENT DOCUMENTS

| 4,164,704 | 8/1979 | Kato et al. ................................. 324/73 |
| 4,230,985 | 10/1980 | Matrone ................................. 324/158 |
| 4,322,682 | 3/1982 | Schadwill ............................... 324/158 |
| 4,352,061 | 9/1982 | Matrone . | |
| 4,626,776 | 12/1986 | Wilkinson . | |
| 4,771,234 | 9/1988 | Cook et al. .............................. 324/158 |
| 4,774,462 | 9/1988 | Black ....................................... 324/158 |
| 4,803,424 | 2/1989 | Ierardi et al. ........................... 324/158 |
| 4,834,659 | 5/1989 | Mang et al. .............................. 439/55 |
| 4,935,696 | 6/1990 | DiPerna . | |
| 5,055,777 | 10/1991 | Bonelli et al. . | |
| 5,453,702 | 9/1995 | Creeden .................................. 324/761 |

FOREIGN PATENT DOCUMENTS 0 299 232  1/1989  European Pat. Off. ........ G01R 1/073

*Primary Examiner*—Ernest Karlsen
*Attorney, Agent, or Firm*—Karl D. Kovach; David L. Newman

[57] ABSTRACT

A circuit board testing fixture is provided having a top plate spaced apart from a bottom plate and each of the plates having an array of holes for receiving test probes and support rails surrounding and supporting the top and bottom plates on all sides. The testing fixture may also include registration pins in the corners of the plates in order to secure the plates together and a corner clip attached to the registration pins in the corners of the fixture. The testing fixture may further include support pins mounted in the fixture in order to provide additional support to the plates.

20 Claims, 4 Drawing Sheets

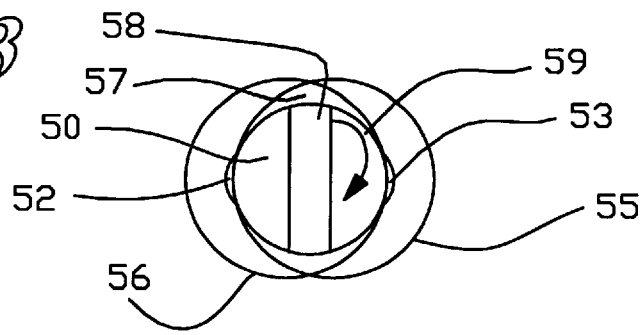
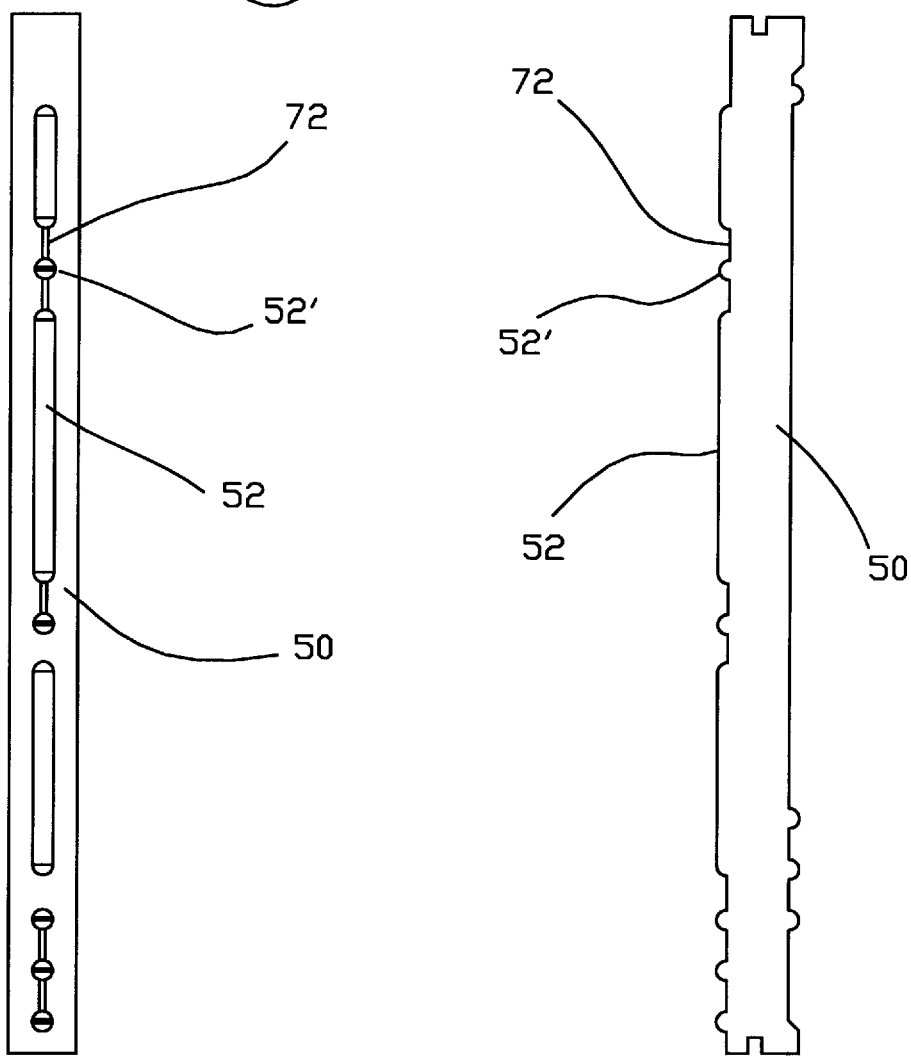

CIRCUIT BOARD TESTING FIXTURE

BACKGROUND OF THE INVENTION

The present invention relates to a circuit board testing fixture and, in particular, to a test fixture having support rails.

The use of a "bed of nails" test fixture has long been known for the testing of printed circuit boards. Such test fixtures include a plurality of metallic test probes arranged to make electrical contact between test points on the circuit board and a high speed electronic test analyzer. The electronic test analyzer has a standard grid of test points. The printed circuit boards to be tested are of varying sizes and the test points on the circuit board are varied from circuit board to circuit board. Therefore, the test fixture is customized for each circuit board pattern and includes a pattern of holes drilled to match the customized array of test points of the printed circuit board at a first plate and a standard grid of holes at a second plate corresponding to the standard grid of the electronic test analyzer. The probes mounted in the fixture in the drilled holes transfer the electrical test signals from the test analyzer to the circuit board in order to detect continuity or lack of continuity between various test points in the circuits on the board. Existing fixtures utilize rigid or resilient spacers to support and secure the various plates of the fixture together. Common fixtures have a top plate and a bottom plate and multiple intermediate plates residing therebetween. Vertical support members are placed periodically throughout the fixture in order to establish the total fixture height and position and support all intermediate plates and to maintain the spacing between the plates. These vertical support members are generally secured to the top and bottom plates with screws. In addition, each level of the fixture requires an individual support member at that level in order to support each plate at each level. Fixtures using such a support system may require at least one hundred pieces to provide the sufficient rigidity between all of the plates. Such an arrangement, having so many parts is costly. In addition, the assembly and disassembly time for such a fixture can be more than thirty minutes per fixture. Further, the additional drilling of holes in order to accommodate the screws of the support members requires additional time and labor, requiring an additional ten to fifty holes per fixture depending on the size of the fixture.

Therefore, it is an object of the present invention to provide a testing fixture which has a minimum number of pieces and is quickly and easily assembled while providing a rigid fixture to house test probes.

It is another object of the present invention to provide a testing fixture which includes a box-like configuration without the use of screws.

It is a further object of the present invention to provide a method of assembling a test fixture which is quickly and easily assembled.

SUMMARY OF THE INVENTION

A principal object of this invention is to provide a circuit board testing fixture comprising a top plate spaced apart from a bottom plate, each of the plates having an array of holes for receiving test probes and support rails surrounding and supporting the top and bottom plates on all sides. The support rail may include ledges for receiving the plates. The support rail may include a support strip for supporting and securing the top plate. The support rail may include a support strip for supporting and securing the bottom plate. A support pin may be mounted within the fixture. The support pin may include ribs protruding from the cylindrical edges of the support pin to engage and support the plates of the fixture. The support pin may be received in holes placed in the plates along a central axis wherein the holes are offset from one another along the central axis providing an intersecting area of the holes along the axis sufficient to receive the support pin therethrough. The pins may have a slot at each end. A corner clip may be attached to fixture at a corner. The corner clip may include wings having fingers that support the support rails. The corner clip may include a hole for receiving a registration pin. The corner clip may attach to a corner of the fixture having first holes placed in the corner of the plates, the corner clip having second holes which align with the first holes of the plates and a registration pin inserted through the first and second holes. The fixture may include a retention layer mounted in the fixture for retaining the test probes therein. The test probes may include a retention means for aiding in retention of the probes in the fixture. The retention means may include a groove placed at each end of the probe. The fixture may be secured together without any screws.

In an embodiment, a circuit board testing fixture is provided comprising a top plate spaced apart from a bottom plate, each of the plates having an array of holes for receiving test probes and a support pin mounted within the fixture including ribs protruding from the cylindrical edges of the support pin to engage and support the plates of the fixture and the support pin received in holes placed in the plates on a central axis wherein the holes are offset from one another along the central axis providing an intersecting area of the holes along the axis sufficient to receiving the support pin therethrough. The fixture may include support rails surrounding and supporting the top and bottom plates on all sides. The fixture may include intermediate plates mounted in the fixture between the top and bottom plates and the intermediate plates are surrounded and supported by the support rails.

In an embodiment, a circuit board testing fixture is provided comprising a top plate spaced apart from a bottom plate, each of the plates having an array of holes for receiving test probes, support rails surrounding and supporting the top and bottom plates on all sides, a support pin mounted within the fixture having ribs protruding from the cylindrical edges to engage and support the plates of the fixture and a corner clip attached to the fixture at a corner of the plates, both having a hole therein for simultaneously receiving a registration pin therethrough.

These and other features of the invention are set forth below in the following detailed description of the presently preferred embodiments.

BRIEF DESCRIPTION OF THE DRAWINGS

FIG. 3 is a top view of the holes drilled in the plates of the testing fixture of FIG. 2;

FIG. 4 is a side-elevation view of a support pin of the present invention;

FIG. 5 is a side-elevation view of a support pin of the present invention as shown in FIG. 4 rotated 90°.

DETAILED DESCRIPTION OF THE PRESENTLY PREFERRED EMBODIMENTS

Figure 1:
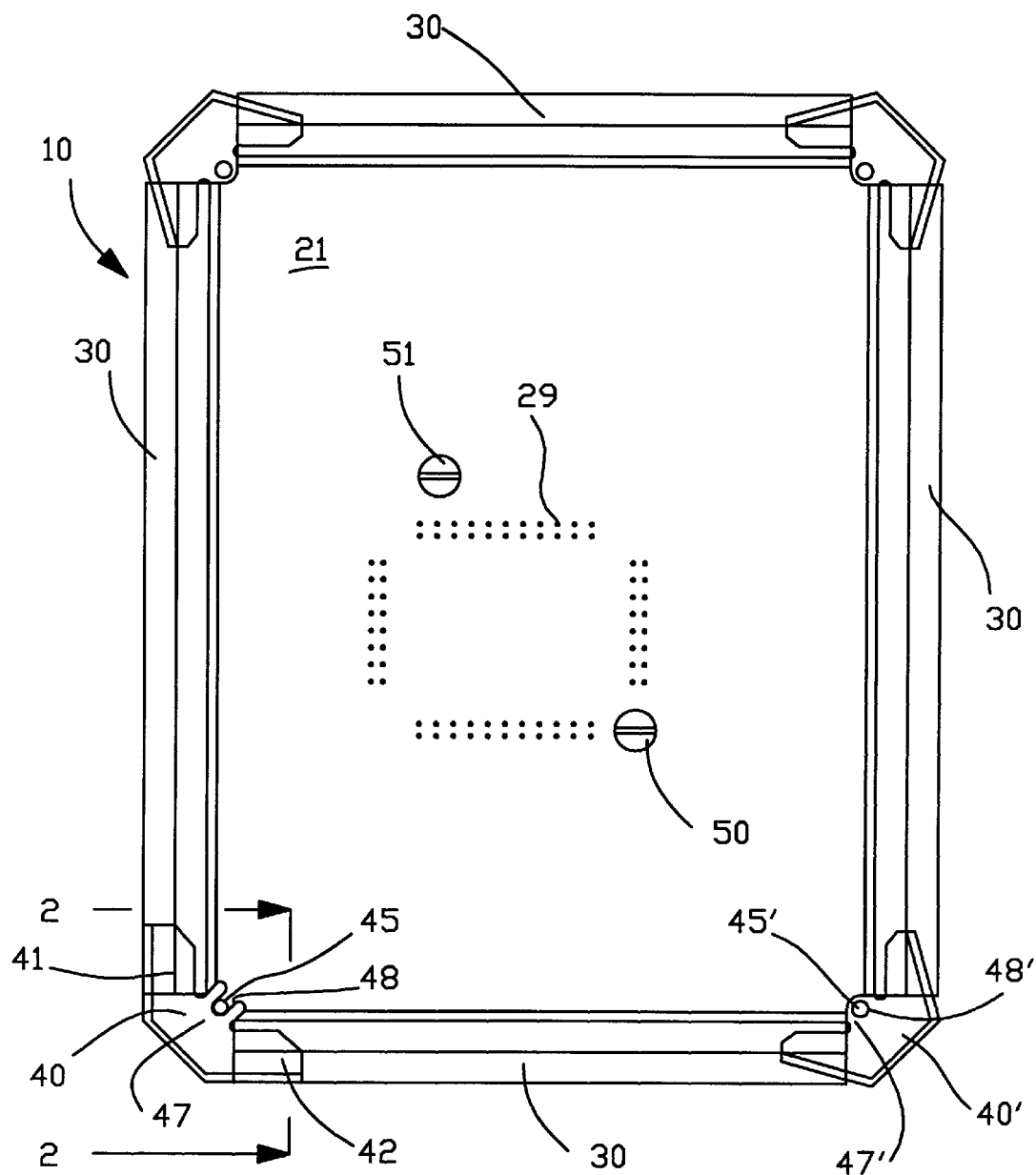
FIG. 1 is a plan view of the testing fixture of the present invention.

The present invention is best understood with reference to FIGS. 1–6. Turning to FIG. 1, a plan view of a test fixture 10 having a top plate 21 bounded on four sides by support rails 30. Located beneath the top plate 21 are other plates 21, such as a bottom plate. The support rails 30 are secured to the plates 21 via a friction fit of the support rails 30 to the plates 21 and via corner clips 40. The corner clips 40 have wings 41,42. The wings 41,42 include fingers which support the support rails 30. In the corners of the plates are drilled holes which receive registration pins 45. In the preferred embodiment of the corner clip 40 the clip 40 includes a neck portion 47 which includes a U-shaped gap 48 for receiving the registration pin 45. After the rails 30 are attached to the plates 21 on all four sides, the registration pin 45 is then inserted through holes drilled in the corners of the plates 21. The corner clip 40 is then slid into position at the corner by sliding the wings 41,42 against the support rails 30 and sliding the U-shaped gap 48 around the registration pin 45.

In an alternate embodiment, a corner clip 40' may be used having a hole 48' formed in the neck portion 47'. In this way, the assembly of the fixture 10 is slightly different than discussed above. The support rails 30 are attached to all four sides of the plates 21. The corner clip 40' is then attached to the corners by sliding the wings against the support rails 30 so that the hole 48' of the corner clip 40' is aligned with the hole in the corner of the plates 21. The registration pin 45' is then inserted simultaneously through the holes in the corners of the plates 21 and the hole 48' of the corner clip 40'.

The plates 21 include an array of holes 29 drilled therein. The top plate 21 has a standard grid array corresponding to the grid array of an electronic test analyzer. The bottom plate has an array of holes drilled corresponding to the test location points of the printed circuit board to be tested. Intermediate plates between the top plate 21 and the bottom plate have holes drilled therein linear to the corresponding hole in the top plate 21 and the bottom plate. Upon insertion of test probes into the holes 29 the probe will be supported by the holes of all of the plates. Also mounted in the plates 21 are support pins 50,51. In the embodiment shown in FIG. 1, two support pins are shown. In an embodiment the dimensions of the testing fixture 10 would be approximately fourteen inches×eighteen inches. A fixture of such a size would likely require two support pins 50,51 in order to properly support the plates at the internal areas of the testing fixture 10.

Figure 2:
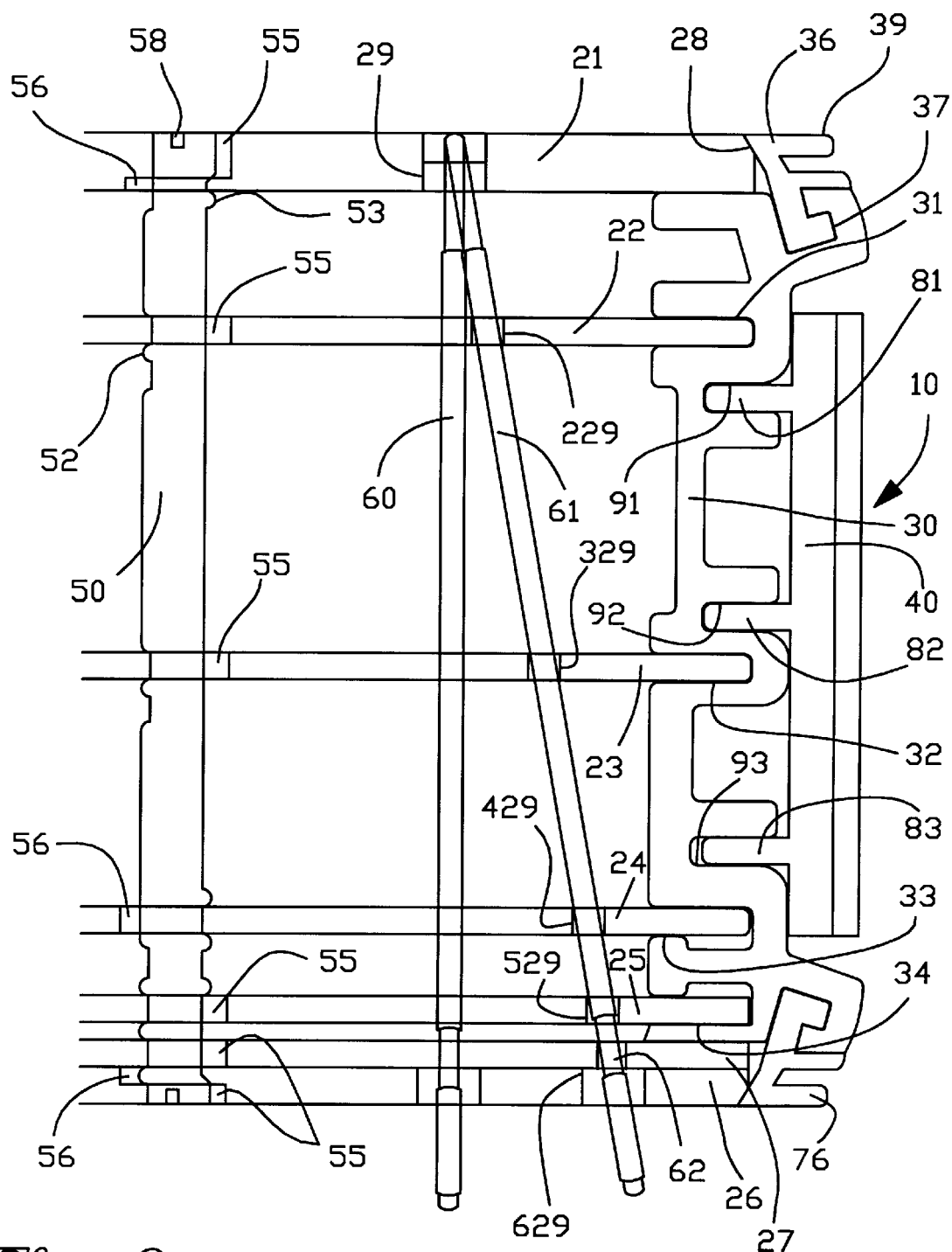
FIG. 2 is a side-elevation view of the testing fixture of FIG. 1 taken at line 2—2.

Turning to FIG. 2, a side-elevation of the testing fixture 10 taken at line 2—2 of FIG. 1 is shown. FIG. 2 is enlarged in order to show the levels of the fixture 10 clearly and also the figure is compressed horizontally in order to show test probes 60 and support pin 50. The support rail 30 includes ledges 31,32,33,34 for supporting the intermediate plates 22,23,24 and 25, respectively. In a preferred embodiment, the support rail 30 may be extruded of a plastic material such as rigid PVC or molded from a polymer material. In the embodiment shown in FIG. 2, there are four intermediate plates 22,23,24 and 25 and a top plate 21 and bottom plate 26. However, the present invention may be adapted to form a testing fixture of any arrangement. For example, having only a top plate 21 and bottom plate 26 or having more or less than four intermediate plates. In order to accommodate such differences, the support rail 30 may be modified or extruded to have more or less ledges in order to support the varying amounts of plates to be supported by the support rail 30. Located at the top end of the support rail 30 is a support strip 36 which slides into a channel 37 of the support rail 30. The support strip 36 secures the top plate 21 onto the fixture 10 by putting pressure against the angled surface 28 of the top plate 21. The support strip 36 includes a gripping surface 39 which may be depressed downward in the direction of the support rail 30 in order to relieve pressure in the channel 37, so that the strip 36 may be slid from the channel 37. The top plate 21 may then be removed from the fixture 10. Likewise, a second support strip 76 is attached to the bottom of the support rail 30 in order to hold the bottom plate 26 to the fixture 10. This embodiment having a support rail 30 including a support strip 36, provides for the ability to modify the fixture 10 and allow for increased serviceability of the fixture 10. There are instances when the top plate 21 and bottom plate 26 may need to be removed in order to service the fixture 10. In an alternate embodiment, the support rail 30 may be formed so that the support strips 36 are integral with the support rail 30 and the top plate 21 and bottom plate 26 would be slid into the support rail similar to the attachment of the intermediate plates 21,22,23,24 and 25.

The top plate includes probe holes 29. The grid array of holes 29 in the top plate each has a corresponding hole in the lower plates 22,23,24,25 and 26. For example, hole 29 corresponds to hole 229 of the intermediate plate 22 which corresponds to hole 329 of the intermediate plate 23 which corresponds to hole 429 of intermediate plate 24 which corresponds to hole 529 of intermediate plate 25 which corresponds to hole 629 of bottom plate 26. A probe 61 is inserted in these corresponding holes 29, 229, 329, 429, 529 and 629 in order to support the probe 61 at all plate levels. Upon insertion of the probe into the fixture 10, it is guided properly into its proper position by insertion through the linearly aligned holes 29, 229, 329, 429, 529 and 629, so that the test area of the printed circuit board is electrically connected to the corresponding point of the test analyzer. The test fixture 10 may include any known means of retaining the test probe 60,61 within the fixture. The test probes in a preferred embodiment are not a wire probe. For example, the test probe may have a reduced diameter portion 62 which engages a retention layer 27 which may be formed of a flexible material such as mylar or rubber. As shown in FIG. 2, the probes 60,61 each have a reduced diameter portion, or groove at each end. The retention layer 27 has a hole of a smaller diameter and the holes of the intermediate plates in order that the probe is gripped and retained in its position within the fixture 10. The present invention may include any retention means and may accommodate any type of test probe. It is common to have as many as three thousand test probes populating each testing fixture 10.

A support pin 50 is inserted in the test fixture 10 and provides for support of the plates at internal areas of the testing fixture 10. The support pin 50 includes ribs 52 which protrude from the edges of the pin 50 at areas corresponding to the locations of the plates 21,22,23,24,25 and 26. The ribs 52 protrude from the pin 50 only at limited areas around the circumference of the pin 50. Therefore, the majority of the support pins 50 have a uniform circular diameter except for the protruding rib portions 52 that protrude in a 1°–5° area around the 360° of the support pin 50. In this way, the pin 50 may be inserted into the fixture 10 through all of the plates and then rotated 90° so that the ribs 52 engage the plates in order to provide support to the plates. It can be seen that holes 55 are offset to the right and holes 56 are offset to the left of a central axis. Each of the individual holes 55,56 has a diameter of approximately 0.250 inches. The corresponding support pin 50 has a diameter at its largest point where ribs 52 protrude of approximately 0.022 inches. As shown in FIG. 3, the holes 55 offset to the right and the holes 56 offset to the left form an intersecting area 57 which is ovoid in shape. The intersecting area 57 of the holes 55,56 has a diameter at its longest point of that equal to or greater than the diameter of the support pin 50 at its greatest width. The pin 50 is shown in FIG. 3 in its fully mated position having the ribs 52,53 engaging the edge of the holes 55,56, respectively. Upon rotation of the pin 50 ninety degrees in the direction of arrow 59, the ribs 52,53 will be moved into the overlapping area 57 of the holes 55,56 so that the pin 50 may be removed from or inserted into the fixture 10. According to this construction of the support pin 50 and the offset holes 55,56, the pin may be easily inserted and withdrawn from the fixture and upon rotation ninety degrees, support of all of the plates may be attained by the movement of the ribs 52,53 into position at the edges of the holes 55,56. In a preferred embodiment, the support pin 50 is formed of a polymer material which may be injection molded according to the preferred orientation of the fixture. Thus, if a fixture having intermediate plates spaced apart by a greater or lesser amount is desired, the support pin 50 may easily be molded or formed to the proper size and shape. The support pins 50 also include slots 58 at each end for insertion of a screwdriver or other tool in order to aid in the rotation of the support pin 50 in order to rotate the ribs 52,53 into position.

Corner clip 40 is attached to the corners of the fixture 10 by inserting the fingers 81,82,83 into the notches 91,92,93 of the support rail 30. The fingers 81,82,83 of the corner clip 40 protrude from the wing 42 of the corner clip 40 and help to transfer the forces from the support rails 30 to the corners of the fixture and the registration pins 45 which are attached to the corner clip 40. In an embodiment having differently spaced plates and requiring a varying support rail 30, the fingers 81,82 and 83 of the corner clip 40 may be formed in different locations to correspond to the support points of the support rail 30.

Turning to FIG. 4, a side-elevation view of the support pin 50 is shown having the ribs 52,52' shown protruding from the overall cylindrical surface of the pin 50. Also located between the ribs 52,52' are engagement flats 72 which also protrude from the overall cylindrical surface of the pin 50. The engagement flats 72 help to engage the edges of the holes 55,56 of the plates so that upon rotation of the pin 50 90° to move the ribs 52,52' under the plates, the engagement flat 72 rubs against the edges of the holes and provides for a friction fit of the pin 50 against the edges of the holes 55,56 so that the pin 50 will remain in its locked position. FIG. 5 is another view of the support pin 50 shown rotated 90° from that shown in FIG. 4. The ribs 52,52' and engagement flats 72 protrude from the edges of the cylindrical surface of the pin 50.

Figure 6:
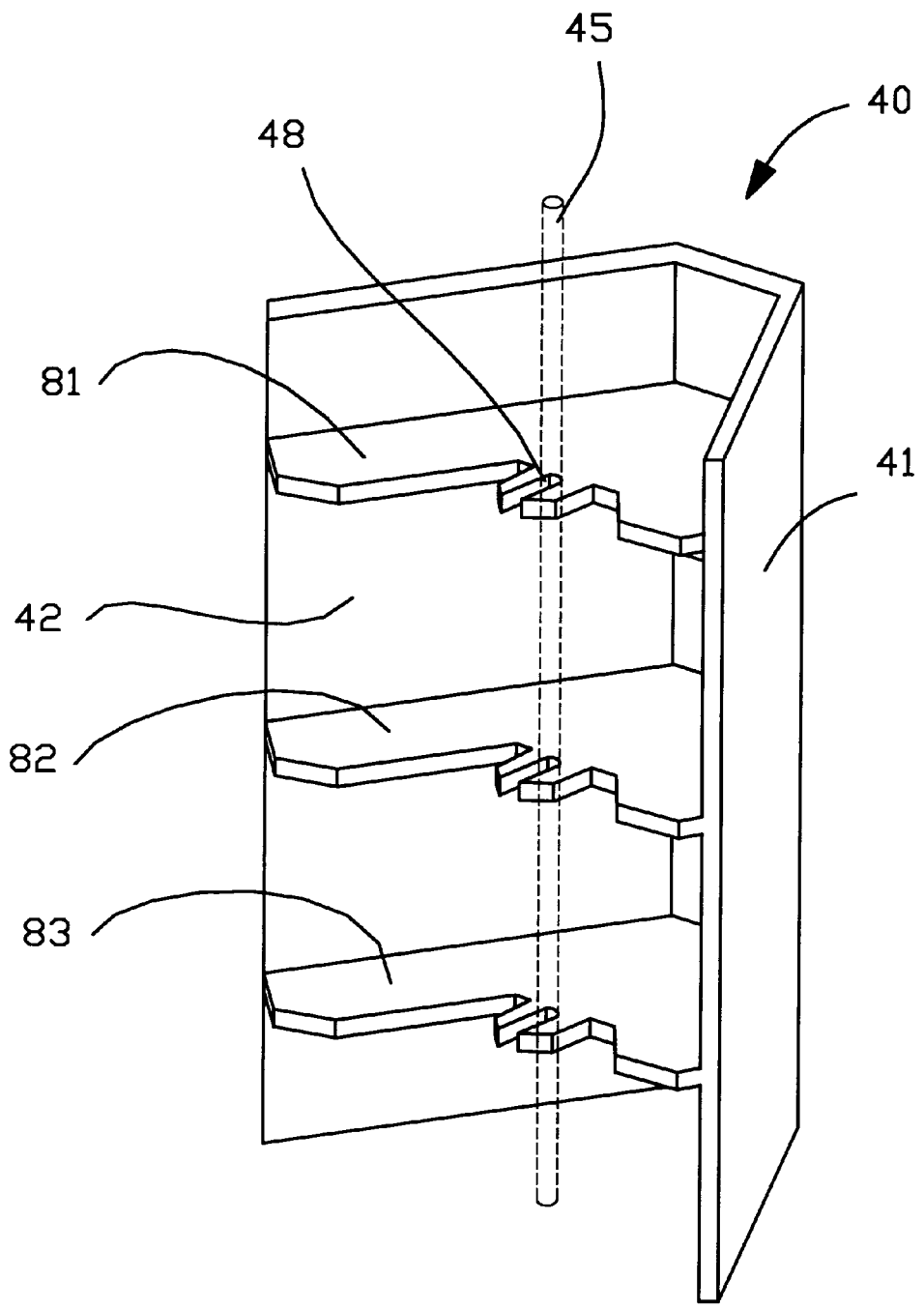
FIG. 6 is a perspective view of a corner clip of the present invention.

FIG. 6 shows a perspective view of a corner clip 40 of the present invention showing wings 41,42 and fingers 81,82 and 83. Gap 48 is shown receiving registration pin 45. In a preferred embodiment, the corner clip 40 is molded of a polymer material such as acetate (Delrin).

In accordance with the above description, it can be understood that a testing fixture 10 is provided having a rigid, solid structure which provides for the support of the top and bottom plates 21,26 and intermediate plates 22,23, 24 and 25 and provides for the consistent separation of the plates across the entire length of the plates. The above invention allows for the exertion of 16,000 lbs. of force to be placed against the top plate 21 of the fixture 10 without causing the deformation of the fixture 10 or warping of the plates. Compression posts may also be included in the testing fixture 10 in order to offset extreme compression forces placed on the fixture in the vertical direction.

In accordance with the above description, it can also be understood that the entire testing fixture 10 is assembled without the use of screws or the traditional spacers having individual pieces between each plate throughout the fixture assembly. Thus, the overall advantage of the present invention may be understood which provides for a quickly assembled testing fixture 10, in a preferred embodiment having four corner clips, four support rails, four corner registration pins, a top and bottom plate and any number desired intermediate plates. No other parts are required to assemble the testing fixture 10. Depending on the size of the testing fixture, support pins 50 and compression posts may be added. In a preferred method of assembling the present invention, the following steps are carried out. A first support rail 30 is placed on a flat surface having its ledges 31,32, 33,34 facing up or exposed. All of the required plates are inserted in the corresponding ledges of the first support rail by sliding the edge of the plate between the two walls of ledges 31,32,33 and 34. The plates are retained on the support rail by the friction fit of the ledges against the top and bottom edges of the plates. A second support rail is attached to the plates on the side opposite the first support rail. A third and fourth support rail is then placed on the two remaining sides of the group of plates in order to completely enclose and surround the plates and forming a box-like structure. The registration pins are placed in the corners of the plates and the corner clips attached as discussed above. Support pins may be inserted in the fixture in pre-drilled holes as discussed above. Finally, the testing fixture may be populated with test probes according to any known methods such as via an automatic probe loading machine.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A circuit board testing fixture comprising:

a top plate and a bottom plate with an intermediate plate therebetween, the plates being aligned vertically with each other, and each of the plates having an array of holes for receiving a plurality of test probes;

at least one support rail having a molded frame with a top and bottom end, the support rail extending vertically to secure a side of each plate and to retain each of said plates apart from the other plates; and a support pin extending vertically from the top plate to the bottom plate and having a rib protruding horizontally to support either of the plates.

2. The fixture of claim 1 wherein the circuit board testing fixture comprises:

a plurality of intermediate plates, wherein the support rail includes a plurality of support ledges for supporting each intermediate plate individually.

3. The fixture of claim 1 wherein: the support rail includes a means for snapping the support rail to the plates.

4. The fixture of claim 1 wherein the support rail includes a means for providing a friction fit in order to secure the support rail to the plates.

5. The fixture of claim 1 wherein the support rail includes a support strip for supporting the top plate.

6. The fixture of claim 1 wherein the support rail includes a support strip for supporting the bottom plate.

7. The fixture of claim 1 wherein the support pin is received in holes placed in the plates along a central axis wherein the holes are offset from one another along the central axis providing an intersecting area of the holes along the axis sufficient to receive the support pin therethrough.

8. The fixture of claim 1 wherein the pins have a slot at each end.

9. The fixture of claim 1 wherein a corner clip is attached to the fixture at a corner.

10. The fixture of claim 9 wherein the corner clip includes wings having fingers that allow the corner clip to snap-fit with the support rails.

11. The fixture of claim 9 wherein the corner clip includes a hole for receiving a registration pin.

12. The fixture of claim 9 wherein the corner clip attaches to a corner of the fixture having first holes placed in the corner of the plates, the corner clip having second holes which align with the first holes of the plates and a registration pin inserted through the first and second holes.

13. The fixture of claim 1 including a retention layer mounted in the fixture for retaining the test probes therein.

14. The fixture of claim 1 wherein the test probes include a retention means for aiding in retention of the probes in the fixture.

15. The fixture of claim 14 wherein the retention means includes a groove placed at each end of the probe.

16. The fixture of claim 1 wherein the fixture is secured together without any screws.

17. A circuit board testing fixture comprising:

a top plate and a bottom plate with an intermediate plate therebetween, the plates being rectangular and aligned vertically with each other, each of the plates having an array of holes for receiving a plurality of test probes;

a support rail having a molded frame with a top and bottom end and a support ledge in between the top and bottom end, the support rail extending vertically to secure a side of each plate and to retain each of said plates separate from other of said plates, wherein the support ledge supports the intermediary plate;

a support pin mounted within the fixture and extending vertically from the top plate to the bottom plate and having ribs protruding horizontally to engage and support each of the plates; and a corner clip attached to the fixture at a corner of each plate, the corner clip and plates having a hole therein for simultaneously receiving a registration pin therethrough.

18. A circuit board testing fixture comprising:

a top plate and a bottom plate with an intermediate plate therebetween, the plates being rectangular and aligned vertically with each other, and each of the plates having an array of holes for receiving a plurality of test probes;

a support rail having a molded frame with a top and bottom end and a support ledge in between the top and bottom end, the support rail extending vertically to secure a side of each plate and to retain each of said plates apart from the other plates, wherein the support ledge supports the intermediary plate; and a support pin extending vertically from the top plate to the bottom plate and having a rib protruding horizontally to support either of the plates.

19. The circuit board testing fixture of claim 18 wherein a corner clip is attached to a corner of each plate, the corner clips and plates having a hole therein for simultaneously receiving a registration pin therethrough.

20. The circuit board testing fixture of claim 19 wherein the support ledges of the support rail slideably supports the corresponding plate.

\* \* \* \* \*

(12) EX PARTE REEXAMINATION CERTIFICATE (7184th)
United States Patent
Frans et al.

(10) Number: US 5,939,892 C1
(45) Certificate Issued: *Nov. 24, 2009

(54) CIRCUIT BOARD TESTING FIXTURE

(75) Inventors: John S. Frans, Clairmont, CA (US); Joseph M. Creeden, Alto Loma, CA (US)

(73) Assignee: Test Connections, Inc., Upland, CA (US)

( * ) Notice: This patent issued on a continued prosecution application filed under 37 CFR 1.53(d), and is subject to the twenty year patent term provisions of 35 U.S.C. 154(a)(2).

Reexamination Request:
No. 90/008,554, Apr. 30, 2007

Reexamination Certificate for:
Patent No.: 5,939,892
Issued: Aug. 17, 1999
Appl. No.: 08/631,407
Filed: Apr. 12, 1996

(51) Int. Cl.
*G01R 31/02* (2006.01)
*G01R 1/073* (2006.01)

(52) U.S. Cl. ................................. 324/761; 324/758
(58) Field of Classification Search .................. None
See application file for complete search history.

(56) References Cited

U.S. PATENT DOCUMENTS

| 3,288,301 A | 11/1966 | Kent et al. ..................... 211/41 |
| 4,164,704 A | 8/1979 | Kato et al. ............... 324/73 PC |
| 4,721,908 A | 1/1988 | Driller et al. ................. 324/158 |
| 5,575,076 A | 11/1996 | Creeden ....................... 33/620 |

FOREIGN PATENT DOCUMENTS

| DD | 52439 | 12/1965 |
| DE | 2538934 | 9/1976 |
| DE | 2843019 | 4/1980 |

OTHER PUBLICATIONS

Merriam–Webster's Collegiate Dictionary, 10$^{th}$ ed., pp. 935, 1184.*

* cited by examiner

*Primary Examiner*—Jeffrey L. Gellner

(57) ABSTRACT

A circuit board testing fixture is provided having a top plate spaced apart from a bottom plate and each of the plates having an array of holes for receiving test probes and support rails surrounding and supporting the top and bottom plates on all sides. The testing fixture may also include registration pins in the corners of the plates in order to secure the plates together and a corner clip attached to the registration pins in the corners of the fixture. The testing fixture may further include support pins mounted in the fixture in order to provide additional support to the plates.

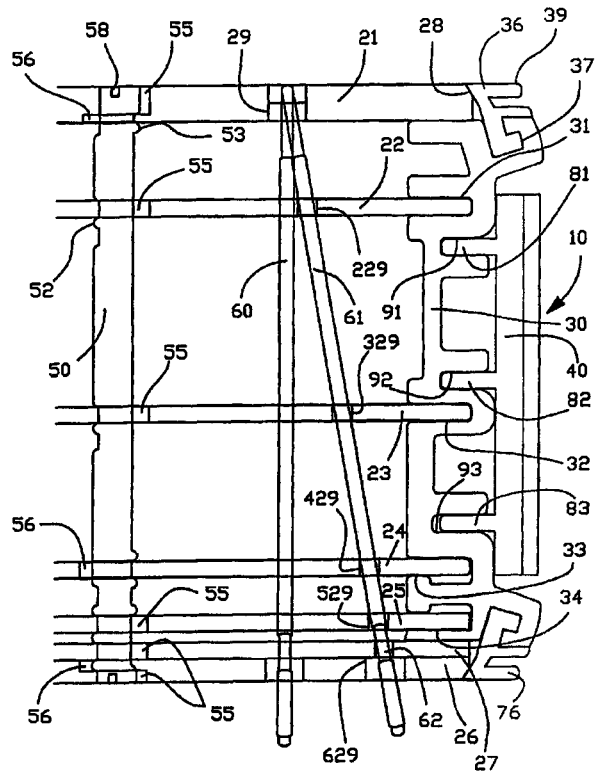

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 5, 7 and 15 is confirmed.

Claims 1–4, 6, 13, 14 and 18 are cancelled.

Claims 8–12, 16, 17, 19 and 20 were not reexamined.

\* \* \* \* \*